(12) United States Patent
Givens et al.

(10) Patent No.: US 6,271,593 B1
(45) Date of Patent: Aug. 7, 2001

(54) METHOD FOR FABRICATING CONDUCTIVE COMPONENTS IN MICROELECTRONIC DEVICES AND SUBSTRATE STRUCTURES THEREFOR

(75) Inventors: John H. Givens, Meridian; Richard H. Lane, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/385,130

(22) Filed: Aug. 27, 1999

Related U.S. Application Data

(62) Division of application No. 08/917,666, filed on Aug. 21, 1997, now Pat. No. 6,080,655.

(51) Int. Cl.$^7$ .................................................. H01L 23/485
(52) U.S. Cl. .................... 257/752; 257/758; 257/760; 257/637; 257/640
(58) Field of Search .................... 257/635, 637, 257/640, 750, 751, 752, 763, 764, 758, 760; 438/619, 622, 633, 627

(56) References Cited

U.S. PATENT DOCUMENTS

| | | |
|---|---|---|
| 5,300,813 | 4/1994 | Joshi et al. . |
| 5,371,047 | 12/1994 | Greco et al. . |
| 5,403,776 | 4/1995 | Tsuji et al. . |
| 5,466,639 * | 11/1995 | Ireland ................................. 438/624 |
| 5,484,740 * | 1/1996 | Cho ...................................... 438/619 |
| 5,578,523 * | 11/1996 | Fiordalice et al. ................... 438/633 |
| 5,612,254 | 3/1997 | Mu et al. . |
| 5,614,765 | 3/1997 | Avanzino et al. . |
| 5,635,423 * | 6/1997 | Huang et al. ........................ 438/624 |
| 5,726,100 | 3/1998 | Givens . |
| 5,739,579 * | 4/1998 | Chiang et al. ....................... 257/635 |
| 5,741,626 * | 4/1998 | Jain et al. ............................ 430/311 |
| 5,753,967 * | 5/1998 | Lin ....................................... 257/635 |
| 5,801,094 * | 9/1998 | Yew et al. ............................ 438/740 |
| 5,817,572 | 10/1998 | Chiang et al. . |
| 5,858,877 | 1/1999 | Dennison et al. . |
| 5,877,076 | 3/1999 | Dai . |
| 5,882,996 | 3/1999 | Dai . |
| 5,926,732 | 7/1999 | Matsura . |
| 5,933,761 | 8/1999 | Lee . |
| 5,935,762 | 8/1999 | Dai et al. . |
| 6,080,655 * | 6/2000 | Givens et al. ....................... 438/626 |

* cited by examiner

*Primary Examiner*—Mary Wilczewski
(74) *Attorney, Agent, or Firm*—Perkins Coie LLP; www.perkinscoie.com

(57) ABSTRACT

A method and substrate structure for fabricating highly conductive components on microelectronic devices. In one embodiment in accordance with the principles of the present invention, a first dielectric layer is formed over a base layer of a substrate, a second dielectric layer is deposited onto the first dielectric layer, and a third dielectric layer is deposited onto the second dielectric layer. The first, second and third dielectric layers define a dielectric stratum in which the first and second dielectric layers may be selectively etchable from one another so that the second dielectric layer etches at a faster rate than the first layer in the presence of a selective etchant. After the dielectric layers are deposited onto the substrate, a void is etched through the second and third dielectric layers. The void may be etched in a two part process in which a non-selective etchant etches through the third dielectric layer to an intermediate level in the second dielectric layer, and then a selective etchant etches through the remaining portion of the second dielectric layer to the first dielectric layer. The third dielectric layer is subsequently covered with a conductive material, and the void is filled with a portion of the conductive layer. The substrate is then planarized to the third layer to form a conductive component in the void. The third dielectric layer generally has a lower polishing rate than the conductive layer so that the third dielectric layer acts as a polish-stop layer for the planarizing process. Although the method is applicable to forming virtually any type of conductive component on a substrate, it is particularly useful for forming gold components in contact holes and/or trenches.

10 Claims, 6 Drawing Sheets

METHOD FOR FABRICATING CONDUCTIVE COMPONENTS IN MICROELECTRONIC DEVICES AND SUBSTRATE STRUCTURES THEREFOR

CROSS-REFERENCE TO RELATED APPLICATION this application is a divisional of U.S. patent application Ser. No. 08/917,666, filed Aug. 21, 1997, now U.S. Pat. No. 6,080,655.

TECHNICAL FIELD

The present invention relates to fabricating conductive components in the manufacturing of microelectronic devices. More specifically, the invention relates to fabricating gold damascene lines and gold interlayer contact vias in integrated circuits.

BACKGROUND OF THE INVENTION

Microelectronic devices are used in computers, communications equipment, televisions and many other products. Typical microelectronic devices include processors, memory devices, field emission displays and other devices that have circuits with small, complex components. In current manufacturing processes, the components of such circuits are generally formed on a substrate or a wafer with conductive, insulative, and semiconductive materials. Each substrate typically has 50–200 microelectronic devices, and each microelectronic device may have several million components. Accordingly, there is a significant drive in the microelectronic device industry to reduce the size and increase the density of components in integrated circuits.

As the density of components in integrated circuits increases, the highly conductive components of an integrated circuit need to be extremely small to provide enough space for the other components. Typical high conductivity components in integrated circuits include runners, damascene lines, contact plugs/vias, dual-damascene lines and other highly conductive components. To provide additional space for the other components of an integrated circuit, the major cross-sectional dimension of many highly conductive components is approximately 0.3 $\mu$m or less. In several applications, the major dimension of highly conductive components is preferably 0.18 $\mu$m or less.

Highly conductive components are formed on top of dielectric layers or in voids in dielectric layers. Conductive lines on top of a dielectric layer, for example, may be formed by depositing a conductive layer over the dielectric layer and then etching the conductive layer to electrically isolate conductors on top of the dielectric layer. Conductive components may also be formed in dielectric layers. For example, damascene lines are a type of conductive line fabricated by etching trenches in a silicon oxide layer down to a silicon nitride etch-stop layer, filling the trenches with a highly conductive material, and then planarizing the wafer down to the silicon oxide layer. Contact vias/plugs are another type of conductive component fabricated by etching vertical holes through a dielectric layer and filling the holes with a highly conductive material. Highly conductive components are generally composed of aluminum, copper or tungsten.

Although conventional conductive components perform adequately for many applications, highly conductive components are beginning to limit the performance of extremely high density integrated circuits with very small components because the resistance per unit length of long, narrow conductive lines is undesirably high. Aluminum is desirable for short or wide conductive features, but it is too resistive for use in long, narrow conductive components. Copper is more conductive than aluminum, but the resistance per unit length of copper conductive components may be too high for long, narrow conductive lines because copper loses an electron to surrounding silicon and silicon oxide layers. To prevent copper molecules in damascene lines from losing an electron to the surrounding silicon oxide layer, the trenches are lined with a barrier layer. However, the barrier layer reduces the cross-sectional area of copper damascene lines thereby exacerbating the problem of high resistance per unit length. Tungsten is also used for conductive components, but it is difficult to fill small voids in dielectric layers with tungsten. Accordingly, aluminum, copper and tungsten conductive lines are not well suited for high density integrated circuits with long, narrow conductive lines having a width of 0.3 $\mu$m or less.

SUMMARY OF THE INVENTION

The present invention is a method for fabricating highly conductive components on microelectronic devices and a substrate structure produced by the method. In one embodiment in accordance with the principles of the present invention, a first dielectric layer is formed over a base layer of a substrate, a second dielectric layer is deposited onto the first dielectric layer, and a third dielectric layer is deposited onto the second dielectric layer. The first, second and third dielectric layers define a first dielectric stratum in which the first and second dielectric layers may be selectively etchable from one another so that the second dielectric layer etches at a faster rate than the first layer in the presence of a selective etchant. After the dielectric layers are deposited onto the substrate, a void is etched through the second and third dielectric layers. The void may be etched in a two part process in which a non-selective etchant etches through the third dielectric layer to an intermediate level in the second dielectric layer, and then a selective etchant etches through the remaining portion of the second dielectric layer to the first dielectric layer. The third dielectric layer is subsequently covered with a conductive layer to fill at least a portion of the void with the conductive material of the conductive layer. The substrate is then planarized to the third layer to leave a portion of the conductive material in the void. The third dielectric layer may have a lower polishing rate than the conductive layer so that the third dielectric layer is a polish-stop layer for the planarizing process.

Although the invention is preferably applicable to forming virtually any type of conductive component on a substrate, it is particularly useful for forming gold components in contact holes and/or trenches. In one embodiment, the first dielectric layer is a first silicon nitride layer, the second dielectric layer is a silicon oxide layer, and the third dielectric layer is a second silicon nitride layer. The first silicon nitride layer is an etch-stop layer with respect to the silicon oxide layer in the presence of a selective etchant, while the second silicon nitride layer is preferably a polish-stop for planarizing the conductive layer down to the second silicon nitride layer. Additionally, the silicon oxide layer is a highly insulative, low capacitance layer to electrically isolate the conductive lines from one another. The first dielectric stratum is particularly useful for fabricating gold conductive components because the first and second silicon nitride layers provide diffusion barriers to inhibit the diffusion into or out of gold conductive lines. Additionally, the first dielectric stratum also provides a structure to form gold conductive lines and contact vias without etching the gold because the void is etched prior to depositing the conductive layer and the second silicon nitride layer is a polish-stop layer that inhibits polishing at a level where gold damascene lines are electrically isolated form one another without additional etching.

In still another embodiment, a second dielectric stratum is constructed on the substrate from the third dielectric layer, a fourth dielectric layer deposited onto the third dielectric layer, and a fifth dielectric layer deposited onto the fourth dielectric layer. The fourth dielectric layer may be a second silicon oxide layer and the fifth dielectric layer may be a third silicon nitride layer. Accordingly, a second void may be etched in the fourth and fifth dielectric layers down to the third dielectric layer to form a space in which a second gold component may be fabricated on the substrate. One advantage of an embodiment of the invention, therefore, is that several dielectric stratums may be stacked on each other to efficiently construct several layers of gold conductive components on a single substrate.

DETAILED DESCRIPTION OF THE INVENTION

The present invention is a method and apparatus for fabricating conductive components in the manufacturing of microelectronic devices. It will be appreciated that specific details of the invention are set forth in the following description and in FIGS. 1A–3B to provide a thorough understanding of certain embodiments of the present invention. One skilled in the art, however, will understand that the present invention may have additional embodiments and may be practiced without these details.

Figure 1A:
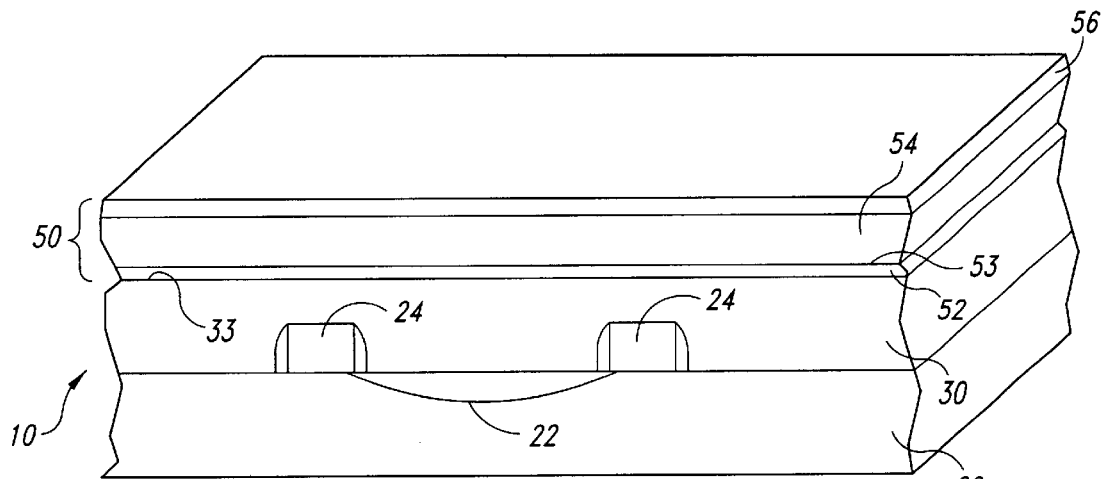
FIG. 1A is a partial schematic isometric view of a substrate upon which a conductive component is to be fabricated according to an embodiment of a method in accordance with the invention.

FIGS. 1A–1E are partial schematic isometric views that illustrate fabricating a dual-damascene conductive structure on a substrate 10 according to one embodiment of the invention. The substrate 10 may be a semiconductor wafer or other type of substrate commonly used for fabricating microelectronic devices. Referring to FIG. 1A, the substrate 10 may have a base layer 20 in which at least one feature 22 is formed by doping the base 20 with appropriate materials or growing the materials on the base layer 20. The base layer 20 may be composed of silicon or other suitable materials, and the feature 22 may be a well, source, drain, field oxide or other type of feature. A number of components 24 may also be formed on the base layer 20 to operate in conjunction with the feature 22. The components 24, for example, may be gates, word lines or other components commonly used in integrated circuits. A passivation or barrier layer 30 composed of a dielectric material is positioned over the base layer 20, the feature 22, and the components 24 to provide a platform upon which or through which additional components may be formed on the substrate 10. The barrier layer 30 is generally a dielectric layer composed of silicon oxide, borophosphate silicon glass (BPSG), tetraethylorthosilicate (TEOS) or other suitable insulative materials. After the barrier layer 30 is deposited, it is planarized so that it has a substantially planar top surface 33.

The substrate 10 also has a dielectric stratum 50 in which conductive components are formed in accordance with the invention. The dielectric stratum 50 has a first dielectric layer 52 on the barrier layer 30, a second dielectric layer 54 on the first dielectric layer 52, and a third dielectric layer 56 on the second dielectric layer 54. The first and second dielectric layers 52 and 54 may be composed of selectively etchable materials so that the first dielectric layer 52 is an etch-stop layer with respect to the second dielectric layer 54 in the presence of a selective etchant. The third dielectric layer 56 may have a low polishing rate so that it forms a polish-stop layer with respect to other layers of materials that may be deposited onto the third dielectric layer 56 in subsequent process steps. The dielectric layers 52, 54 and 56 may each be composed of a different material, or the first and third dielectric layers 52 and 56 may be composed of the same material while the second dielectric layer 54 is composed of a different material. For example, the first dielectric layer 52 may be a first silicon nitride layer, the second dielectric layer 54 may be a first silicon oxide layer and the third dielectric layer 56 may be a second silicon nitride layer. In one embodiment, the thickness of the dielectric layers is as follows: (1) the first dielectric layer 52 is approximately between 50 Å and 1,000 Å thick, and preferably between approximately 150 Å and 350 Å; (2) the second dielectric layer 54 is approximately between 2,500 Å and 8,000 Å thick, and more preferably between 3,500 Å and 5,500 Å; and (3) the third dielectric layer 56 is approximately between 50 Å and 1,000 Å thick, and more preferably between approximately 150 Å and 350 Å. One particular embodiment of the dielectric stratum 50 has a first silicon nitride layer 52 with a thickness of about 250 Å, a first silicon oxide layer 54 with a thickness of about 4,500 Å, and a second silicon nitride layer 56 with a thickness of about 250 Å. However, it will be appreciated that the dielectric layers 52, 54, and 56 may be made from other materials and have other thicknesses. After forming the dielectric stratum 50, conductive components are fabricated in the barrier layer 30 and/or the dielectric stratum 50 to couple the feature 22 and the components 24 with other components (not shown) on the substrate 10.

Figure 1B:
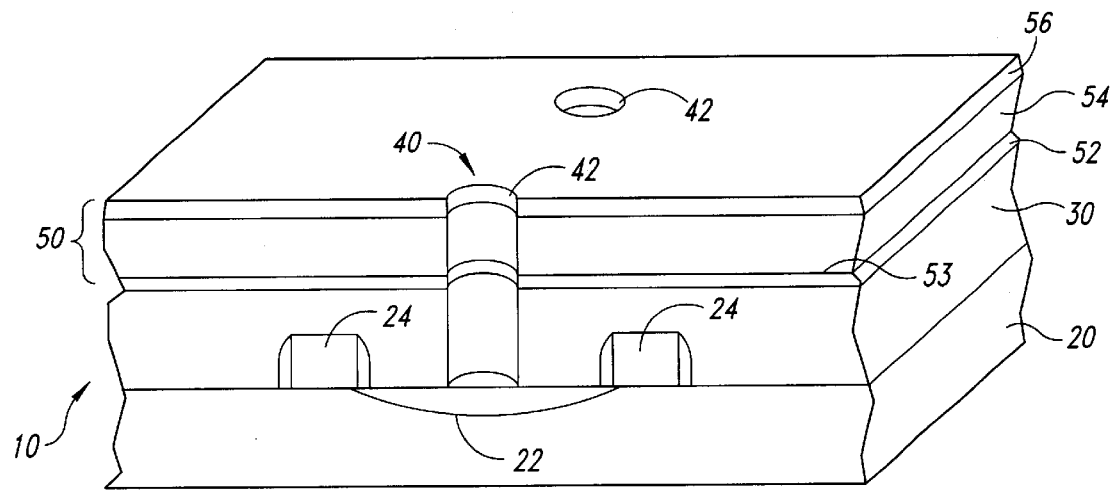
FIG. 1B is a partial schematic isometric view of the substrate of FIG. 1A at a subsequent point of the method.
Figure 1C:
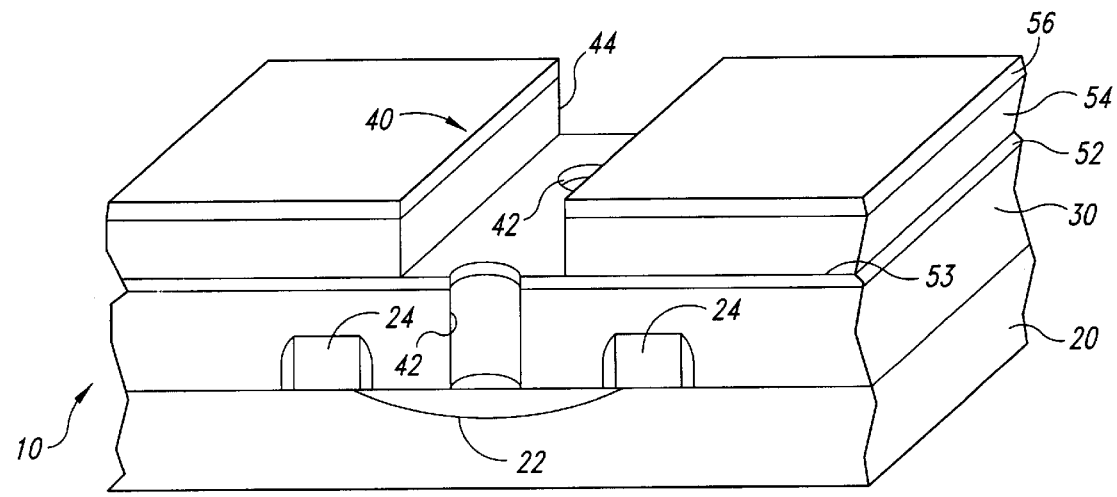
FIG. 1C is a partial schematic isometric view of the substrate of FIGS. 1A and 1B at a subsequent point of the method.

FIGS. 1B and 1C illustrate forming a void 40 for a dual-damascene conductive structure on the substrate 10. FIG. 1B illustrates contact holes 42 bored through the dielectric stratum 50 and the barrier layer 30 to the feature 22 on the base layer 20. The contact holes 42 are bored by patterning the third dielectric layer 56 with a resist (not shown) and etching through the dielectric stratum 50 and the barrier layer 30 with a non-selective etchant that etches through the barrier layer 30 and each of the dielectric layers 52, 54 and 56. Patterning the third dielectric layer 56 with a resist and etching the contact holes 42 is well known in the art. After the contact holes 42 are etched, a trench 44 is cut through the second and third dielectric layers 54 and 56 as shown in FIG. 1C. The trench 44 is cut by patterning the substrate 10 with a second resist (not shown) and etching the second and third dielectric layers 54 and 56 down to a top surface 53 of the second dielectric layer 52. In one embodiment, the trench 44 is cut with a two-step etching process by etching the third dielectric layer 56 with a non-selective etchant that removes the third dielectric layer 56 and a portion of the second dielectric layer 54. The remaining portion of the second dielectric layer 54 is subsequently etched with a selective etchant that removes material from the second dielectric layer 54 faster than from the first dielectric layer 52. As a result, the first dielectric layer 52 may be an etch-stop layer with respect to the second dielectric layer 54 to endpoint the etching of the trench 44 at the first dielectric layer 52. Suitable etchants for selectively etching the second dielectric layer 54 with respect to the first dielectric layer 52 are a function of the materials of the first and second dielectric layers 52 and 54, and are generally well known in the art. The void 40 accordingly has a long, narrow trench 44 and a plurality of contact holes 42 that may be filled with a conductive material to construct a dual-damascene conductive component on the substrate 10.

Figure 1D:
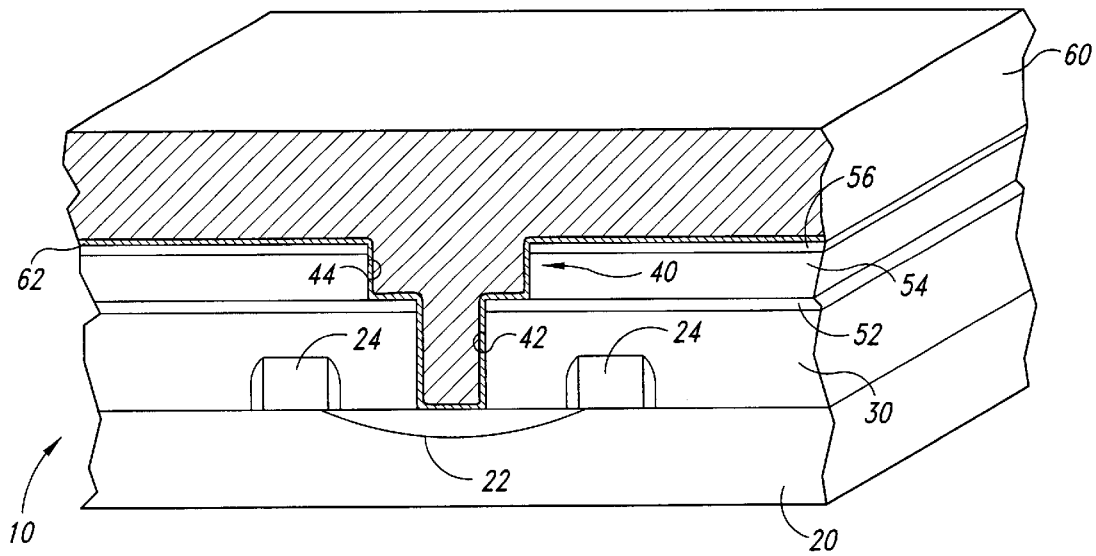
FIG. 1D is a partial schematic isometric view of the substrate of FIGS. 1A–1C at a subsequent point of the method.

FIG. 1D illustrates filling the void 40 with a portion of a conductive layer 60 deposited over the third dielectric layer 56 and the void 40. The conductive layer 60 may be deposited using chemical vapor deposition processes, plasma vapor deposition processes, electrochemical deposition processes or other suitable processes for depositing conductive materials onto substrates. The contact hole 42 and the trench 44 may be filled with a portion of the conductive layer 60 using a hot isotropic pressure process that heats the substrate 10 to plasticize at the conductive layer 60 and applies pressure to the conductive layer 60 to drive a portion of the plasticized conductive layer 60 into the contact holes 42 and the trench 44. However, the contact hole 42 and the trench 44 may be filled with a portion of the conductive layer 60 without using a hot isotropic pressure process. In general, the process used to fill the void 40 with a portion of the conductive layer 60 depends, in part, upon the properties of the specific conductive material, the characteristics of the deposition process, and the structure (e.g., aspect ratio) of the contact holes 42 and the trench 44. The conductive layer 60 may be made from aluminum, copper, silver, gold, tungsten and other suitable conductive materials depending upon the manufacturing and performance requirements of the conductive component. In the case of long, narrow trenches, this embodiment of the present invention is particularly useful for fabricating conductive components composed of gold.

When the conductive layer 60 is composed of gold, an adhesion stratum 62 may be deposited over the substrate 10 and into the void 40 to adhere the gold conductive layer 60 to the substrate 10. The adhesion stratum 62 may be a thin layer of palladium, platinum or other material that preferably diffuses into gold, has a high conductivity, and is substantially oxidation resistant. The adhesion stratum 62 may also be a thin titanium layer deposited directly onto the substrate 10 and a thin palladium or platinum layer deposited onto the titanium layer. The titanium layer act as a gettering layer that cleans the surface of the water and provides a good bonding surface. It will be appreciated that it is generally desirable to position a pad (not shown) of a barrier material (e.g., titanium or tungsten) on top of the base layer 20 at the bottom of the contact hole 42 when the base layer is composed of silicon and the conductive layer is composed of gold or copper. The gold conductive layer 60 may then be deposited onto the substrate 10 by electrochemically depositing a gold ion on the palladium layer of the adhesion stratum 62. The electrochemical deposition of the gold conductive layer 60 may be performed with a gold bath or powder that is electrically attracted to the substrate 10, as known in the art of gold plating. The gold conductive layer 60 and the adhesion stratum 62 are preferably annealed to diffuse the palladium into the gold. Accordingly, the adhesion stratum 62 disappears into the gold so that it does not occupy space within the void 40 that reduces the cross-sectional area of the highly conductive gold in the void 40. Moreover, palladium is also highly conductive so it does not significantly affect the overall conductivity of the gold. After the conductive layer 60 is deposited onto the substrate 10, excess portions of the conductive layer 60 and the adhesive stratum 62 are removed from the top of the third dielectric layer 56 to electrically isolate the remaining portion of the conductive layer in the void 40.

Figure 1E:
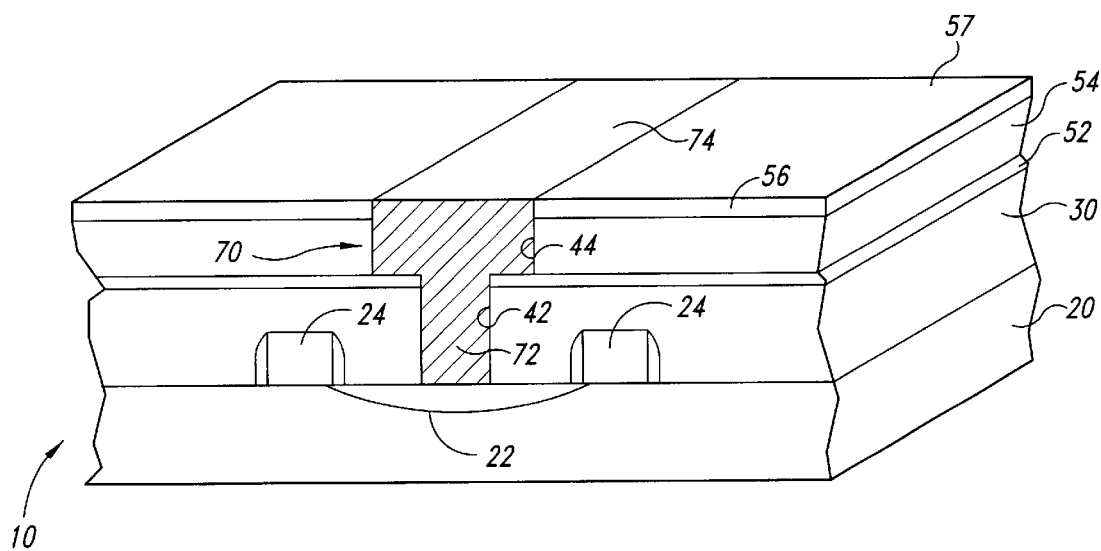
FIG. 1E is a partial schematic isometric view of a substrate with a conductive component fabricated in accordance with the invention.

FIG. 1E illustrates the substrate 10 after the excess portions of the conductive layer 60 and the adhesion stratum 62 have been removed from the wafer to construct a dual-damascene structure 70 with a plurality of contact vias 72 (only one shown) and a damascene line 74. The substrate 10 may be planarized with a mechanical or a chemical-mechanical planarization (CMP) process to remove the excess portions of the conductive layer 60 and the adhesion stratum 62 (shown in FIG. ID) from a top surface 57 of the third dielectric layer 56. In a typical planarizing process, material is removed from the surface of the substrate 10 by pressing the substrate 10 against an abrasive polishing medium and moving at least one of the substrate 10 and the polishing medium with respect to the other to remove material from the substrate 10. In a CMP process, for example, the substrate 10 is pressed against a polishing pad in the presence of a planarizing liquid to mechanically and chemically remove material from the surface of the substrate 10. The third dielectric layer 56 may have a significantly lower polishing rate than the conductive layer 60 and the adhesion stratum 62 so that the third dielectric layer 56 is a polish-stop layer that endpoints the planarization of the substrate 10. The third dielectric layer 56 advantageously endpoints planarization of the substrate 10 at an elevation at which the dual-damascene component 70 is electrically isolated in the contact holes 42 and the trench 44. Additionally, after a gold conductive component has been constructed in the void 40, it may be permanently fixed to the substrate by depositing a cover layer (not shown in FIGS. 1A–1E) over the substrate 10 to seal the gold conductive component in the void.

One advantage of an embodiment of the dielectric stratum 50 is that it enables the consistent fabrication of very small conductive components on a substrate. As the density of integrated circuits increases and the size of the components decreases, it is increasingly important to: (1) adequately insulate the conductive components from each other and the other components on the substrate; and (2) maintain the maximum cross section of highly conductive components to reduce the resistance per unit length. The embodiment of the dielectric stratum 50 shown in FIGS. 1A–1E adequately insulates highly conductive components because the first dielectric layer 52 is an etch-stop layer that prevents the trench 44 from being etched too deep, and the second dielectric layer 54 is composed of a highly resistive material (e.g., silicon oxide) that reduces losses between closely spaced conductive lines. Additionally, the dielectric stratum 50 maintains a desired cross section of the conductive components because the third dielectric layer 56 is a polish-stop layer that prevents over-polishing below a level at which the cross section of the conductive line results in an undesirably high resistance per unit length. Conventional two-layer structures for forming damascene lines provide adequate insulation because they provide an etch stop layer under a silicon oxide insulating layer. However, conventional structures do not provide any polish-stop protection to prevent over-polishing of the silicon oxide layer that may reduce the cross section of the conductive components. Thus, the embodiment of the dielectric stratum 50 shown in FIGS. 1A–1E provides a structure that enables the consistent fabrication of small conductive components.

Another advantage of the method and substrate structure described in FIGS. 1A–1E is that the dual-damascene component 70 may be composed of gold. Compared to copper and aluminum, gold is more conductive, more resistant to oxidation, and more resistant to electromigration. However, gold has not been widely used for fabricating conductive components because gold is difficult to dry etch and deposit with plasma vapor deposition equipment. Additionally, gold does not adhere well to silicon oxides or other materials on substrates. As described below, the dielectric stratum 50 mitigates the problems of fabricating gold conductive components so that long, narrow conductive lines may be fabricated from gold.

An embodiment of the dielectric stratum 50 may provide a structure in which gold conductive components may be constructed without etching the gold because the first dielectric layer 52 provides an etch-stop to limit the depth of the trench and the third dielectric layer 56 provides a polish-stop to accurately endpoint the planarization process. The trench is accordingly etched prior to depositing the gold conductive layer, and the gold cover layer is planarized only to a point at which a sufficient amount of gold is removed from the substrate to electrically isolate the gold in the void without removing too much gold and thus reducing the cross section of the conductive component.

The dielectric stratum 50 also may provide a structure upon which a gold conductive layer 60 may be deposited with inexpensive electrochemical deposition processes instead of expensive plasma vapor deposition processes. The first and third dielectric layers 52 and 56 may be composed of a diffusion resistant material that also has good adhesive properties with gold (e.g., silicon nitride) to act as adhesive diffusion barriers. Thus, a gold conductive layer may be deposited in a relatively strong electrical field because surrounding materials are inhibited from vertically diffusing into the gold and increasing the resistance of the gold.

Additionally, the dielectric stratum 50 and a palladium adhesion stratum 62 together provide a structure that does not significantly effect the resistance per unit length of the gold conductive components. Since palladium is highly conductive and the adhesion stratum 62 is diffused into the gold, neither the cross section of the gold conductive component nor the conductivity of the gold is significantly reduced. Thus, unlike copper damascene lines, gold damascene lines are more likely to have an adequate resistance per unit length for long, narrow conductive lines.

Figure 2A:
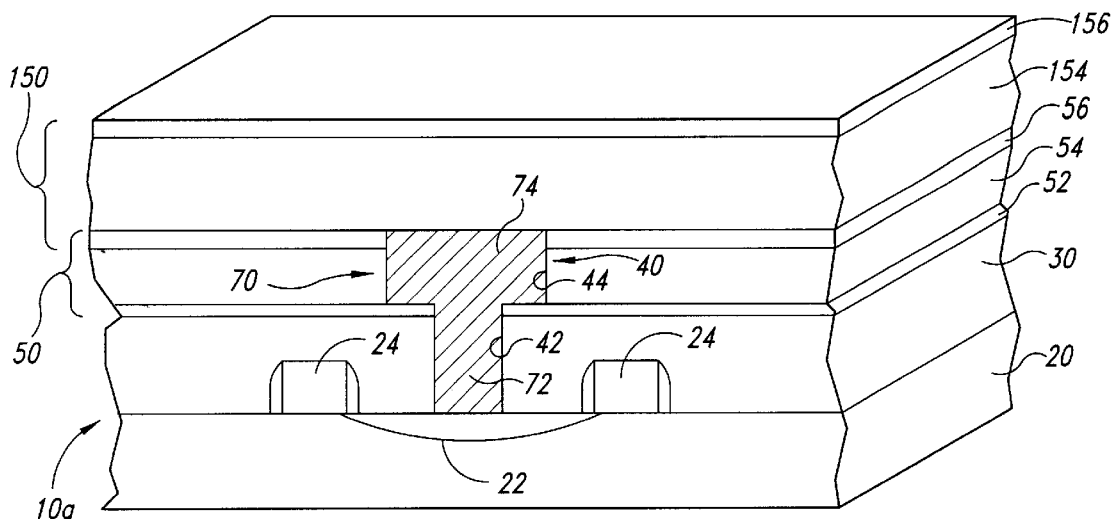
FIG. 2A is a partial schematic isometric view of a substrate upon which a second conductive component is to be fabricated according to another embodiment of a method in accordance with the invention.
Figure 2B:
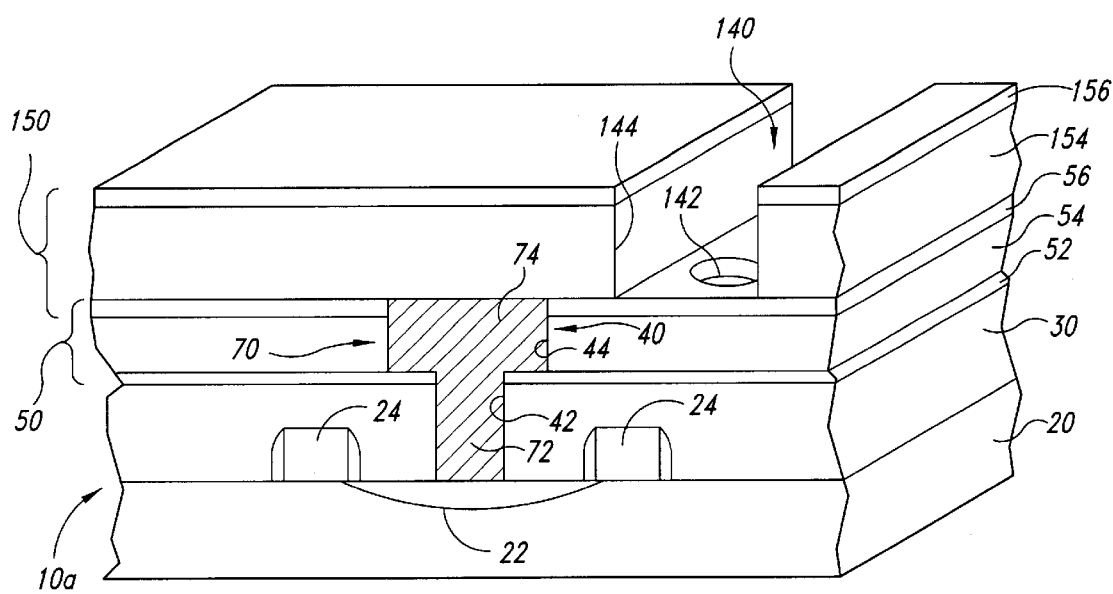
FIG. 2B is a partial schematic isometric view of the substrate of FIG. 2A at a subsequent point of the method.
Figure 2C:
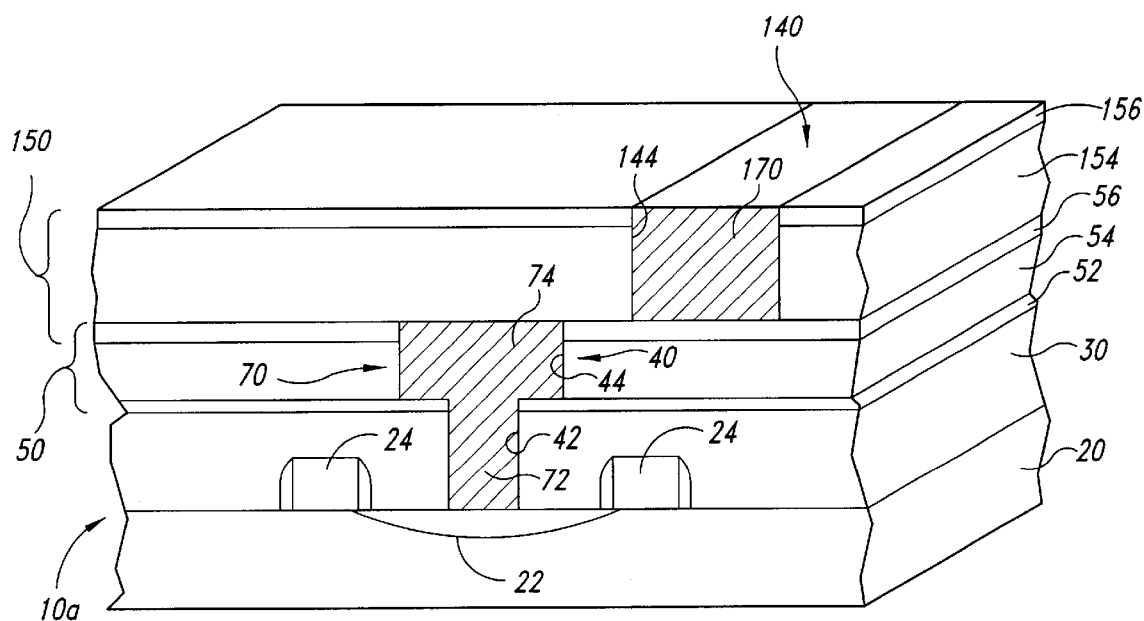
FIG. 2C is a partial schematic isometric view of the substrate of FIGS. 2A and 2B with first and second conductive components fabricated in accordance with the invention.

FIGS. 2A–2C are partial schematic isometric views that illustrate another embodiment of a method and apparatus in accordance with the invention in which first and second conductive components are constructed on a substrate 10a. In FIG. 2A, more specifically, the substrate 10a has a first dielectric stratum 50 over a barrier layer 30, a second dielectric stratum 150 over the first dielectric stratum 50, and a first conductive component 70 fabricated in the first dielectric stratum 50. The first dielectric stratum 50 and the first conductive component 70 may be constructed as described above in FIGS. 1A–1E, and thus like reference numbers in FIGS. 2A-2C refer to like parts in FIGS. 1A–1E.

The second dielectric stratum 150 is composed of the third dielectric layer 56 originally deposited as part of the first dielectric stratum 50, a fourth dielectric layer 154 deposited onto the third dielectric layer 56, and a fifth dielectric layer 156 deposited onto the fourth dielectric layer 154. The fourth dielectric layer 154 may be composed of a selectively etchable material with respect to the third dielectric layer 56 so that the third dielectric layer 56 is an etch-stop layer when cutting a void through the fourth dielectric layer 154. The fifth dielectric layer 156 is preferably composed of a material having a low polishing rate to act as a polish-stop layer for endpointing mechanical or chemical-mechanical planarization of a conductive layer (not shown in FIG. 2A) subsequently deposited onto the substrate 10a. In one embodiment, the first dielectric layer 52 is a first silicon nitride layer, the second dielectric layer 54 is a first silicon oxide layer, the third dielectric layer 56 is a second silicon nitride layer, the fourth dielectric layer 154 is a second silicon oxide layer, and the fifth dielectric layer 156 is a third silicon nitride layer. As described below, the first and second dielectric stratums 50 and 150 are modular isolation structures that can be repeated to fabricate stacks of conductive components on the substrate 10a.

FIGS. 2B and 2C illustrate forming a second conductive component 170 (FIG. 2C) in the second dielectric stratum 150. FIG. 2B, more specifically, illustrates a second void 140 cut into the second dielectric stratum 150 for receiving the conductive material. The second void 140 is preferably offset with respect to the first void 40 to ensure that the first conductive component 70 is sufficiently insulated from a second conductive component formed in the second void 140. The second void 140 may be another dual-damascene structure with a plurality of contact holes 142 (only one shown) extending from the third dielectric layer 56 to an underlying layer, and a trench 144 through the fourth and fifth dielectric layers 154 and 156. In other embodiments (not shown), the second void 140 may be a plurality of contact holes to form contact vias from the fifth dielectric layer 156 to an underlying layer, or a plurality of trenches in the fourth and fifth dielectric layers to form single damascene lines in the second dielectric stratum 150. The second void 140 may be etched in the second dielectric stratum 150 as discussed above with respect to the first void 40 in the first dielectric stratum 50. Accordingly, the trench 144 may be cut with a two part etching process in which a non-selective etchant etches through the fifth dielectric layer 156 to an intermediate point in the fourth dielectric layer 154. A selective etch may then etch through the remaining portion of the fourth dielectric layer 154 to the top of the third dielectric layer 56. Accordingly, the third dielectric layer 56 is not only a polish-stop layer for forming the first conductive component 70, but it is also an etch-stop layer for forming a second conductive component in the second void 140.

FIG. 2C illustrates a second conductive component 170 constructed in the second void 140. The second conductive component 170 is formed by covering the fifth dielectric layer 156 with a conductive layer (not shown), and then planarizing the substrate 10a to the top of the fifth dielectric layer 156. The second conductive component 170 may be composed of gold, silver, aluminum, copper, tungsten or some other material. When the second conductive component 170 is composed of gold, an adhesion stratum (not shown) similar to the stratum 62 described in FIGS. 1A–1E may be deposited onto the substrate 10a under the gold conductive layer to adhere the gold to the substrate 10.

An advantage of the embodiment of the substrate 10a illustrated in FIGS. 2A–2C is that the first and second dielectric stratums 50 and 150 provide modular isolation structures in which different conductive components may be fabricated on the substrate 10a. The first and second dielectric stratums 50 and 150 may be consistently and accurately reproduced to fabricate several layers of gold or other conductive components on the substrate 10a. The first and second dielectric stratums 50 and 150 may also reduce processing steps because the third dielectric layer may be both an etch-stop layer for the first conductive component 70 and a polish-stop layer for the second conductive component 170. Moreover, the fourth dielectric layer 154 provides a cap to hold the first conductive component 70 in place, while also providing an insulative layer for insulating the second conductive component 170.

Figure 3A:
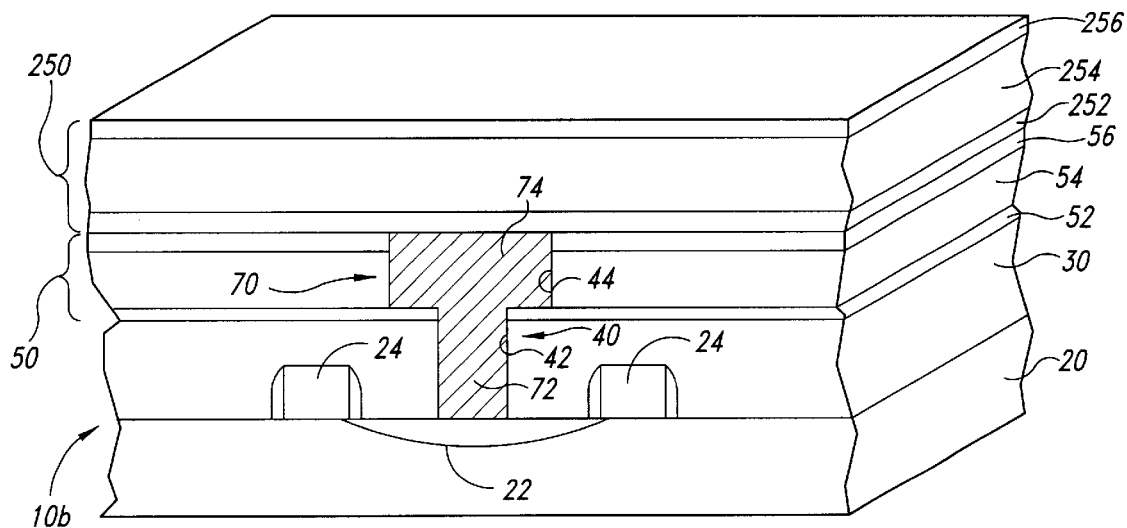
FIG. 3A is a partial schematic isometric view of a substrate upon which a second conductive component is to be fabricated according to another embodiment of a method in accordance with the invention.
Figure 3B:
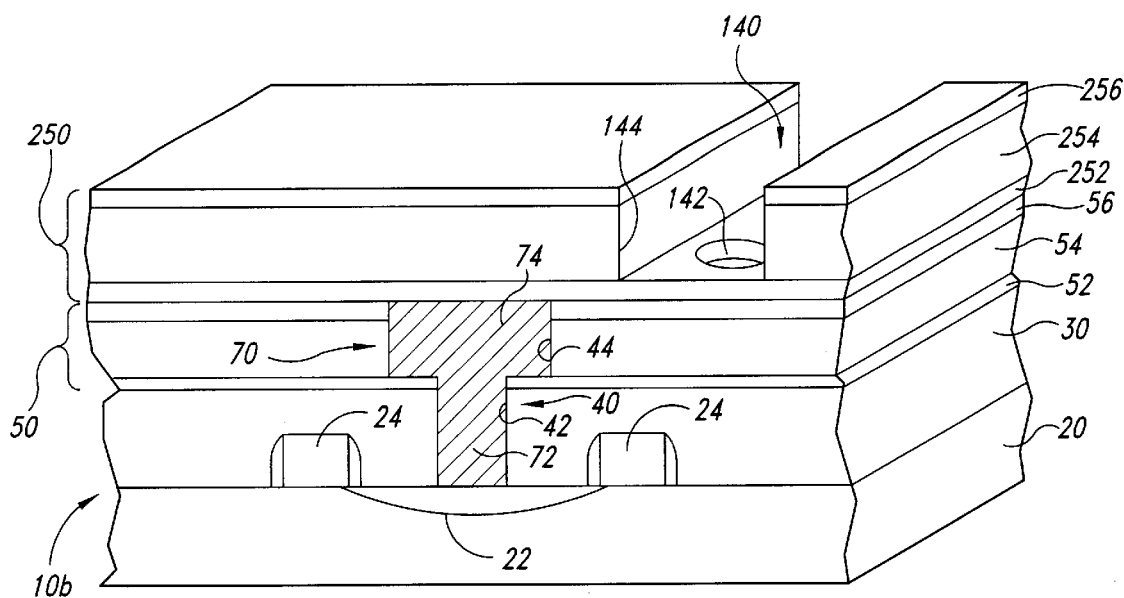
FIG. 3B is a partial schematic isometric view of the substrate of FIG. 3A at a subsequent point of the method.
Figure 3C:
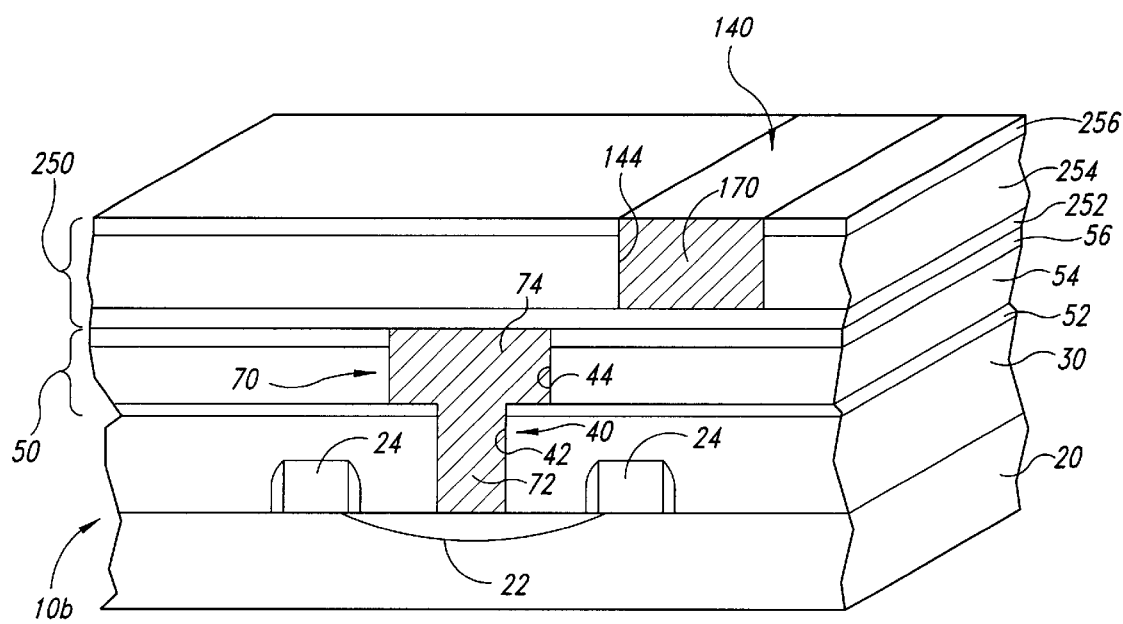
FIG. 3C is a partial schematic isometric view of the substrate of FIGS. 3A and 3B with first and second conductive components fabricated in accordance with another embodiment of the invention.

FIGS. 3A–3C are partial schematic isometric views that illustrate another embodiment in which first and second conductive components are constructed on a substrate 10b. Referring to FIG. 3A, the substrate 10b has a first dielectric stratum 50 with three dielectric layers 52, 54 and 56, and a second dielectric stratum 250 with three separate dielectric layers 252, 254 and 256. The second dielectric stratum 250, more specifically, has a fourth dielectric layer 252 deposited on top of the third dielectric layer 56, a fifth dielectric layer 254 deposited on top of the fourth dielectric layer 252, and a sixth dielectric layer 256 deposited on top of the fifth dielectric layer 254. In one embodiment, the first dielectric layer 52 is a first silicon nitride layer, the second dielectric layer 54 is a first silicon oxide layer, the third dielectric layer 56 is a second silicon nitride layer, the fourth dielectric layer 252 is a third silicon nitride layer, the fifth dielectric layer 254 is a second silicon oxide layer, and the sixth dielectric layer 256 is a fourth silicon nitride layer 256.

Referring to FIGS. 3B and 3C, a second void 140 for a dualdamascene structure is cut in the second dielectric stratum 250. As described above, the second void 140 may be cut with a combination of a non-selective etchant that cuts through the sixth dielectric layer 256 to an intermediate portion of the fifth dielectric layer 254 and a selective etchant cuts through the remaining portion of the fifth dielectric layer 254 to the top surface of the fourth dielectric layer 252. Also as described above, the fourth dielectric layer 252 is preferably an etch-stop layer with respect to the fifth dielectric layer 254, and the sixth dielectric layer 256 is preferably a polish-stop layer. Therefore, as shown by FIG. 3C, the second conductive component 170 may be formed in the trench 140 by depositing a conductive layer (not shown) over the substrate 10b and planarizing the substrate 10b to the sixth dielectric layer 156.

From the foregoing it will be appreciated that, although specific embodiments of the invention have been described herein for purposes of illustration, various modifications may be made without deviating from the spirit and scope of the invention. For example, if the trench 140 in FIG. 3B was close enough to the first conductive line 74 or ran transverse to the first conductive line 74, another dielectric layer similar to layer 54 may be positioned between layers 56 and 252. Accordingly, the invention is not limited except as by the appended claims.

What is claimed is:

1. A microelectronic device, comprising:

a substrate;

a first dielectric layer positioned on the substrate, wherein the first dielectric layer comprises a first silicon nitride layer;

a second dielectric layer on the first dielectric layer, the first and second dielectric layers being selectively removable from the substrate, wherein the second dielectric layer comprises a silicon oxide layer; and a third dielectric layer on the second dielectric layer, the second and third dielectric layers having a pattern of conductive components formed therein, wherein the third dielectric layer comprises a second silicon nitride layer, and wherein the conductive components comprise gold damascene lines in the silicon oxide layer and the second silicon nitride layer.

2. A microelectronic device, comprising:

a substrate;

a first dielectric layer positioned on the substrate, wherein the first dielectric layer comprises a first silicon nitride layer;

a second dielectric layer on the first dielectric layer, the first and second dielectric layers being selectively removable from the substrate, wherein the second dielectric layer comprises a first silicon oxide layer;

a third dielectric layer on the second dielectric layer, the second and third dielectric layers having a first pattern of conductive components formed therein, wherein the third dielectric layer comprises a second silicon nitride layer;

a fourth dielectric layer over the third dielectric layer, the third and fourth dielectric layers being selectively etchable from one another, wherein the fourth dielectric layer comprises a second silicon oxide layer;

a fifth dielectric layer over the fourth dielectric layer, the fourth and fifth dielectric layers having a second conductive component positioned therein, wherein the fifth dielectric layer comprises a third silicon nitride layer;

the first conductive component is a first gold damascene line in the first silicon oxide layer and the second silicon nitride layer extending along a longitudinal direction on top of the first silicon nitride layer; and the second conductive component is a second gold damascene line in the second silicon oxide layer and the third silicon nitride layer extending along the longitudinal direction on top of the second silicon nitride layer.

3. The device of claim 2 wherein the second gold damascene line is offset with respect to the first gold damascene line so that the first and second damascene lines do not overlap along the longitudinal direction.

4. A microelectronic device, comprising:

a substrate;

a first dielectric layer positioned on the substrate, wherein the first dielectric layer comprises a first silicon nitride layer;

a second dielectric layer on the first dielectric layer, the first and second dielectric layers being selectively removable from the substrate, wherein the second dielectric layer comprises a first silicon oxide layer;

a third dielectric layer on the second dielectric layer, the second and third dielectric layers having a first pattern of conductive components formed therein, wherein the third dielectric layer comprises a second silicon nitride layer;

a fourth dielectric layer over the third dielectric layer, wherein the fourth dielectric layer comprises a third silicon nitride layer;

a fifth dielectric layer over the fourth dielectric layer, the fourth and fifth dielectric layers being selectively etchable from one another, wherein the fifth dielectric layer comprises a second silicon oxide layer; and a sixth dielectric layer over the fifth dielectric layer, the fifth and sixth dielectric layers having a second conductive feature positioned in the fifth and sixth layers, wherein the sixth dielectric layer comprises a fourth silicon nitride layer.

5. The device of claim 4 wherein:

the first conductive component is a first gold damascene line in the first silicon oxide layer and the second silicon nitride layer extending along a longitudinal direction on top of the first silicon nitride layer; and the second conductive component is a second gold damascene line in the second silicon oxide layer and the fourth silicon nitride layer extending along the longitudinal direction.

6. A conductive component in a microelectronic device comprising:

a first dielectric layer having a first thickness, the first dielectric layer being positioned on a substrate, wherein the first dielectric layer comprises a first silicon nitride layer;

a second dielectric layer on the first dielectric layer, the first and second dielectric layers being selectively etchable with respect to each other, wherein the second dielectric layer comprises a first silicon oxide layer; and a third dielectric layer on the second dielectric layer, the second and third dielectric layers having a plurality of conductive components corresponding to a desired pattern of conductive components, wherein the third dielectric layer comprises a second silicon nitride layer, and wherein the conductive components comprise gold damascene lines in the silicon oxide layer and the second silicon nitride layer.

7. A conductive component iii a microelectronic device comprising:

a first dielectric layer having a first thickness, the first dielectric layer being positioned on a substrate, wherein the first dielectric layer comprises a first silicon nitride layer;

a second dielectric layer on the first dielectric layer, the first and second dielectric layers being selectively etchable with respect to each other, wherein the second dielectric layer comprises a first silicon oxide layer;

a third dielectric layer on the second dielectric layer, the second and third dielectric layers having a plurality of conductive components corresponding to a desired pattern of conductive components, wherein the third dielectric layer comprises a second silicon nitride layer;

a fourth dielectric layer over the third dielectric layer, the third and fourth dielectric layers being selectively etchable from one another, wherein the fourth dielectric layer comprises a second silicon oxide layer;

a fifth dielectric layer over the fourth dielectric layer, the fourth and fifth dielectric layers having a plurality of second conductive components corresponding to a desired pattern of second conductive components positioned therein, wherein the fifth dielectric layer comprises a third silicon nitride layer;

wherein the first conductive components comprise first gold damascene lines in the first silicon oxide layer and the second silicon nitride layer extending along a longitudinal direction on top of the first silicon nitride layer; and wherein the second conductive components comprise second gold damascene lines in the second silicon oxide layer and the third silicon nitride layer extending along the longitudinal direction.

8. The device of claim 7 wherein the second gold damascene lines are offset with respect to the first gold damascene lines so that the first and second damascene lines do not overlap along the longitudinal direction.

9. A conductive component in a microelectronic device comprising:

a first dielectric layer having a first thickness, the first dielectric layer being positioned on a substrate, wherein the first dielectric layer comprises a first silicon nitride layer;

a second dielectric layer on the first dielectric layer, the first and second dielectric layers being selectively etchable with respect to each other, wherein the second dielectric layer comprises a first silicon oxide layer;

a third dielectric layer on the second dielectric layer, the second and third dielectric layers having a plurality of conductive components corresponding to a desired pattern of conductive components, wherein the third dielectric layer comprises a second silicon nitride layer;

a fourth dielectric layer over the third dielectric layer, wherein the fourth dielectric layer comprises a third silicon nitride layer;

a fifth dielectric layer over the fourth dielectric layer, the fourth and fifth dielectric layers being selectively etchable from one another, wherein the fifth dielectric layer comprises a second silicon oxide layer; and a sixth dielectric layer over the fifth dielectric layer, the fifth and sixth dielectric layers having a plurality of second conductive components corresponding to a desired pattern of conductive components positioned therein, wherein the sixth dielectric layer comprises a fourth silicon nitride layer.

10. The device of claim 9 wherein:

the first conductive components comprise first gold damascene lines in the first silicon oxide layer and the second silicon nitride layer extending along a longitudinal direction on top of the first silicon nitride layer; and the second conductive components comprise second gold damascene lines in the second silicon oxide layer and the fourth silicon nitride layer extending along the longitudinal direction.

* * * * *

UNITED STATES PATENT AND TRADEMARK OFFICE
CERTIFICATE OF CORRECTION

PATENT NO. : 6,271,593 B1
DATED : August 7, 2001
INVENTOR(S) : Givens et al.

It is certified that error appears in the above-identified patent and that said Letters Patent is hereby corrected as shown below:

<u>Column 11,</u>
Line 49, "iii" should be -- in --;

Signed and Sealed this

Fourth Day of June, 2002

Attest:

JAMES E. ROGAN
Attesting Officer  Director of the United States Patent and Trademark Office